(12) United States Patent
Lee et al.

(10) Patent No.: US 6,222,476 B1
(45) Date of Patent: Apr. 24, 2001

(54) ARCHITECTURE TO REDUCE ERRORS DUE TO METASTABILITY IN ANALOG TO DIGITAL CONVERTERS

(75) Inventors: Sang-Soo Lee, Cupertino; Tzu-Wang Pan, San Jose, both of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/386,029

(22) Filed: Aug. 30, 1999

(51) Int. Cl.$^7$ ...................................... H03M 1/36
(52) U.S. Cl. ............................................... 341/159
(58) Field of Search .................... 341/154, 160, 341/118, 155, 64, 97

(56) References Cited

U.S. PATENT DOCUMENTS

| | | | |
|---|---|---|---|
| 5,382,955 | * | 1/1995 | Knierim .................................. 341/64 |
| 5,959,564 | * | 9/1999 | Gross ..................................... 341/160 |

OTHER PUBLICATIONS

Cideciyan, Roy D.; Dolivo, Francois; Hermann, Beto; Hirt, Walter, "A PRML System for Digital Magnetic Recording", Jan. 1, 1992, IEEE Journal on Selected Areas in Communications.

* cited by examiner

*Primary Examiner*—Brain Young

(57) ABSTRACT

A system and method for reduced metastability errors in an analog-to-digital converter ("ADC") are disclosed. The ADC comprises comparators configured to output a thermometer code and a thermometer-to-binary encoder for converting the thermometer code to a digital output. The thermometer-to-binary encoder includes a transition detection logic to generate a transition codeword having at least one transition bit corresponding to a transition point in the thermometer code, an intermediate encoding logic to encode the transition codeword into first intermediate signals, a converter logic to convert the first intermediate signals into converted intermediate signals such that same converted intermediate signals result from first intermediate signals corresponding to a transition codeword having more than one transition bit and first intermediate signals corresponding to another transition codeword having one of the more than one transition bit, and a converted signals mapper for mapping the converted signals to the digital output. The transition detection logic may include inverters and AND gates where a threshold voltage of each inverter is preferably greater than a threshold voltage of each corresponding AND gate to which the output of each inverter is input.

16 Claims, 5 Drawing Sheets

| BIT LOCATION OF LOGIC 1 BIT IN TRANSITION CODEWORD Z | WORD LINE IN THERMOMETER-TO-BINARY ENCODER 108 FOR 4-BIT ADC ($b_3, b_2, b_1, b_0$) |
|---|---|
| 15 | 1111 |
| 14 | 1110 |
| 13 | 1101 |
| 12 | 1100 |
| 11 | 1011 |
| 10 | 1010 |
| 9 | 1001 |
| 8 | 1000 |
| 7 | 0111 |
| 6 | 0110 |
| 5 | 0101 |
| 4 | 0100 |
| 3 | 0011 |
| 2 | 0010 |
| 1 | 0001 |
| 0 | 0000 |

ARCHITECTURE TO REDUCE ERRORS DUE TO METASTABILITY IN ANALOG TO DIGITAL CONVERTERS

BACKGROUND OF THE INVENTION

1. Field of the Invention

The present invention relates generally to an analog-to-digital converter. More specifically, an analog-to-digital converter having reduced metastability errors is disclosed.

2. Description of Related Art

Flash analog-to-digital converter ("ADC") is often utilized in high-speed signal processing applications. Examples of such high-speed signal processing applications include hard disk drive ("HDD") read channel, digital video, instrumentation, and telecommunication. One goal for analog-to-digital converters is low error rate. Typical flash ADC architecture employs comparators coupled to thermometer-to-binary encoding logic that output the binary code digital output. Thus, reducing comparator metastability errors in high-speed ADCs is critical for achieving low error rate in the final digital output of the ADCs.

Metastability error occurs when the difference at the two inputs of a comparator is small. The comparator circuit requires a relatively long period of time to produce a well-defined logic output when the input differential is relatively small. Generally, all comparators have a small input differential voltage range for which the output does not reach the full logic level, e.g., either a logic high ("1") or a logic low ("0"), in a given clock period. Because the comparator is coupled to the downstream encoder of the ADC, the subsequent logic gates in the encoder may interpret the logic level output from the comparator at an incorrect level. Such incorrect interpretation of the comparator output often causes a gross error in the final binary code digital output.

One method for reducing metastability error is to improve the design of comparators. However, comparator requirements for low error rates often conflict with requirements for other performance metrics. Another method for reducing metastability error is to employ Gray encoding as an intermediate step to lower the probability of metastable states. However, employing the Gray encoding requires a relatively complex Gray-to-binary conversion between the thermometer and binary codes.

What is needed is a system and method to reducing metastability error in an ADC that is less complex, cost effective and easy to implement.

SUMMARY OF THE INVENTION

An ADC having reduced metastability errors is disclosed. It should be appreciated that the present invention can be implemented in numerous ways, including as a process, an apparatus, a system, a device, or a method. Several inventive embodiments of the present invention are described below.

The n-bit ADC having reduced errors due to metastability comprises a plurality of comparators each adapted to compare an analog input and one of a plurality of comparator reference voltages, the plurality of comparators are configured to output a thermometer code corresponding to the analog input and a thermometer-to-binary encoder for converting the thermometer code to a binary code digital output. The thermometer-to-binary encoder includes a transition detection logic adapted to detect a transition point in the thermometer code and to generate a transition codeword, the transition codeword having at least one transition bit corresponding to the transition point, an intermediate encoding logic adapted to encode the transition codeword into first intermediate signals, a converter logic adapted to convert the first intermediate signals into converted intermediate signals such that same converted intermediate signals result from first intermediate signals corresponding to a transition codeword having more than one transition bit and first intermediate signals corresponding to another transition codeword having one of the more than one transition bit, and a converted signals mapper for mapping the converted signals to the binary code digital output.

In another embodiment, the transition detection logic may include inverters and AND gates where a threshold voltage of each inverter is preferably greater than a threshold voltage of each corresponding AND gate to which the output of each inverter is input.

The method for converting a thermometer code to a binary code comprises generating a transition codeword according to a transition point in the thermometer code, the transition codeword having at least one transition bit corresponding to the transition point, encoding the transition codeword into first intermediate signals, converting the first intermediate signals into converted intermediate signals such that same converted intermediate signals result from first intermediate signals corresponding to a transition codeword having more than one transition bit and first intermediate signals corresponding to another transition codeword having one of the more than one transition bit, and mapping the converted signals to the binary code digital output.

These and other features and advantages of the present invention will be presented in more detail in the following detailed description and the accompanying figures, which illustrate by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which:

FIG. 3 is a table illustrating the mapping of the bit location of the logic 1 bit in a transition codeword to the appropriate word line in the thermometer-to-binary encoder;

FIG. 4 shows logic equations for implementing a two-step encoding process of a 4-bit ADC using intermediate signals;

DESCRIPTION OF SPECIFIC EMBODIMENTS

An analog-to-digital converter having reduced metastability errors is disclosed. The following description is presented to enable any person skilled in the art to make and use the invention. Descriptions of specific embodiments and applications are provided only as examples and various modifications will be readily apparent to those skilled in the art. The general principles defined herein may be applied to other embodiments and applications without departing from the spirit and scope of the invention. Thus, the present invention is to be accorded the widest scope encompassing numerous alternatives, modifications and equivalents consistent with the principles and features disclosed herein. For purpose of clarity, details relating to technical material that is known in the technical fields related to the invention have not been described in detail so as not to unnecessarily obscure the present invention.

Figure 1:
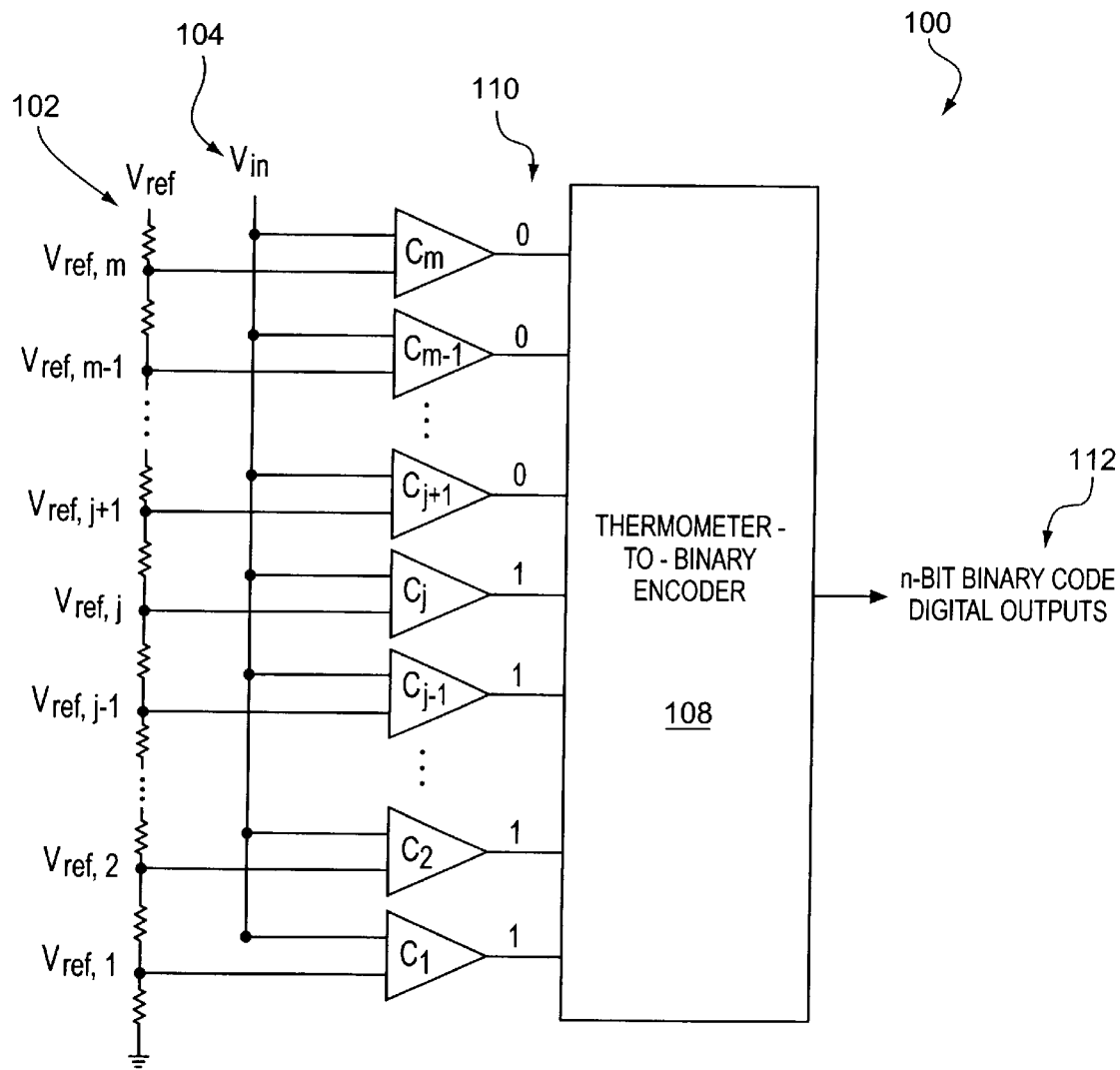
FIG. 1 is a schematic of a typical n-bit flash ADC.

FIG. 1 is a schematic of a typical n-bit flash ADC 100. ADC 100 includes a voltage divider or reference voltage generator 102 for dividing a reference voltage $V_{ref}$ 104, $m=2^n-1$ comparators $C_{1-m}$ 106, and a thermometer to binary encoder 108. The voltage divider 102 may optionally be a resistor voltage divider that divides the reference voltage $V_{ref}$ into m comparator reference voltage levels $V_{ref,\ 1}$ to $V_{ref,\ m}$. A voltage of approximately $V_{ref}/(m+1)$ separates each reference voltage level $V_{ref,\ 1-m}$ from an adjacent reference voltage level.

Each comparator $C_i$, i=1 to m, receives as input an analog input voltage $V_{in}$ and one of the reference voltage levels $V_{ref,\ i}$. The comparator $C_i$ thus compares the difference $(V_{ref,\ i}-V_{in})$. If the difference is positive, i.e., $V_{ref,\ i} > V_{in}$, the comparator $C_i$ outputs a logic 0. Otherwise, the comparator $C_i$ outputs a logic 1. Under normal operating conditions, the m outputs of the m comparators 106 form an m-bit thermometer code 110 which corresponds to the analog input $V_{in}$. The m-bit thermometer code 110 generally consists j logic 1's in the lower bit positions and m-j logic 0's in the higher bit positions, i.e., 000 . . . 000111 . . . 111, i.e., a transition from a logic 1 to a logic 0 occurs between bit j bit j+1. In other words, the outputs of comparators $C_1$ to $C_j$ are all logic 1's while the outputs of comparators $C_{j+1}$ to $C_m$ are all logic 0's.

The m-bit thermometer code 110 is input to the thermometer-to-binary encoder 108. A transition detection logic of the thermometer-to-binary encoder 108 detects the transition point from a logic 1 to logic 0 at bit j in the thermometer code and output an m-bit transition codeword. The m-bit transition codeword will be all zero except the bit j which is logic 1. A conversion logic of the thermometer-to-binary encoder 108 utilizes the m-bit transition codeword to turn on an appropriate word line ($j^{th}$ word line) in the encoder and outputs an n-bit binary code digital output 112.

Figure 2:
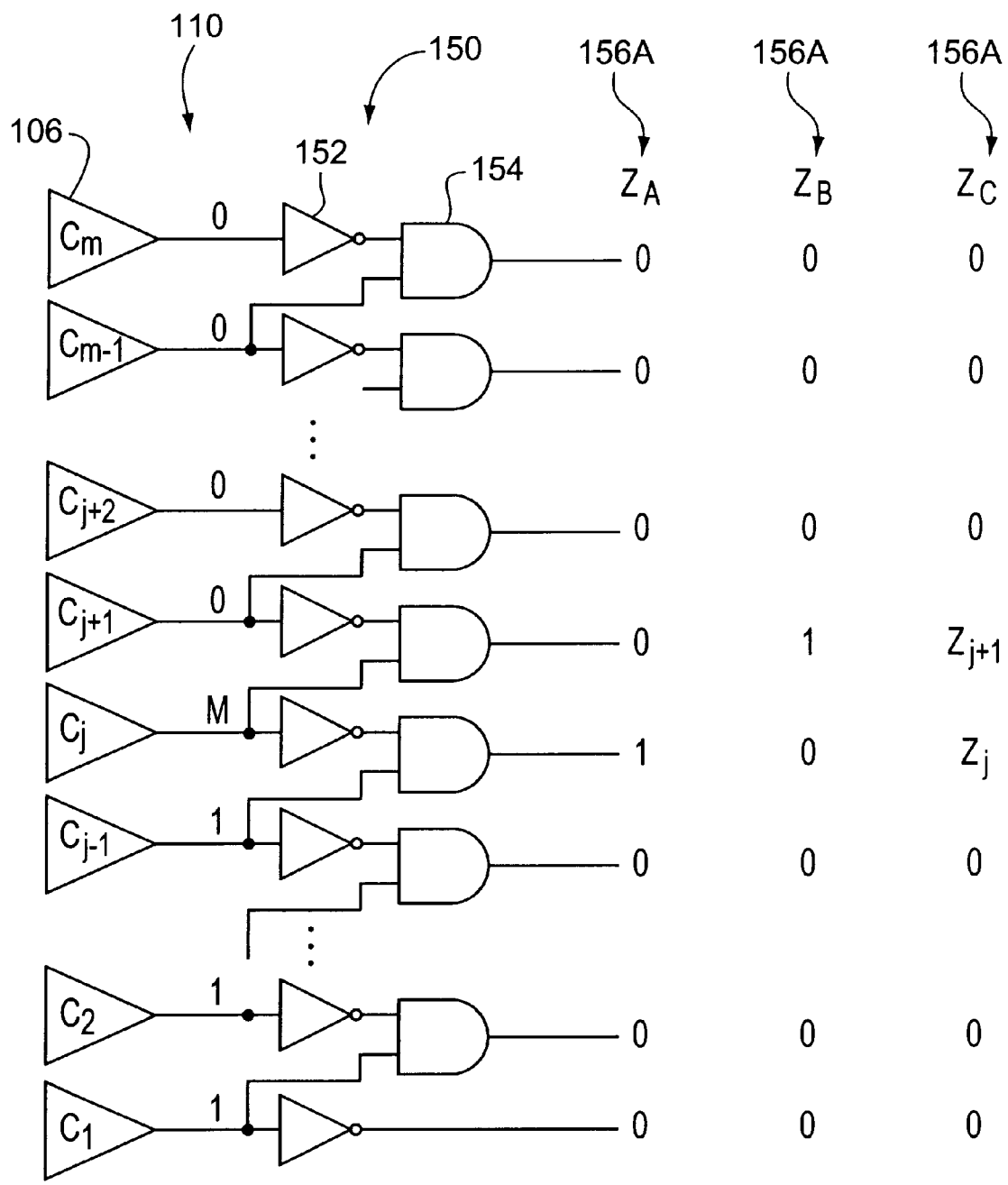
FIG. 2 is a schematic of a portion of a typical transition detection logic of a thermometer-to-binary encoder of the n-bit flash ADC of FIG. 1 illustrating a metastable comparator $C_j$.

FIG. 2 is a schematic of a portion of a typical transition detection logic 150 of the thermometer-to-binary encoder illustrating a metastable comparator $C_j$ 106. As noted above, metastability occurs when the input differential of the comparator is sufficiently small such that the comparator requires a relatively long period of time, e.g., longer than a clock period, to produce a well-defined logic output. Because the comparator is coupled to the downstream thermometer-to-binary encoder of the ADC, the subsequent logic gates in the thermometer-to-binary encoder may interpret the logic level output from the comparator at an incorrect level. Such incorrect interpretation of the comparator output can cause a gross error in the final binary code digital output.

The transition detection logic circuit 150 generally comprises m or $2^n-1$ inverters 152 and m-1 or $2^n-2$ two or more input AND gates 154 to detect the transition point from a logic 1 to logic 0 between bits j and j+1 in the thermometer code to generate the m-bit transition codeword Z 156. The m-bit transition codeword Z 156 contains a logic 1 at a bit location corresponding to the transition point in the thermometer code T 110.

Although the exemplary embodiment has been described and shown as having AND gates, it is to be understood that each AND gate may comprise a NAND gate and an inverter coupled to an output of the NAND gate for purposes ease of circuit implementation, for example. Further, each AND gate may include more than two inputs. To achieve greater robustness and redundancy, each AND gate may receive as inputs one of the non-inverted comparator outputs and one or more, e.g., three, of the inverted comparator outputs, i.e., certain bits of the thermometer code T 110. In addition, such a provision of additional AND gate inputs may further reduce bubble or sparkle errors. As an example, the ith bit of the transition codeword Z 156 may alternately be expressed by:

$$Z_i = (T_i) * (T_{i-1}') * (T_{i-2}') * (T_{i-3}')$$

The logic operation of the transition detection logic circuit 150 will be illustrated by way of examples. In one example, the transition in the m-bit thermometer code occurs between the outputs of comparators $C_j$ and $C_{j-1}$. In such a case, an m-bit transition codeword ZA results where the codeword ZA contains a logic 1 at bit j and logic 0's for all other bits. In another example, the transition in the m-bit thermometer code occurs between the output of comparators $C_j$ and $C_{j+1}$. In such a case, an m-bit transition codeword ZB results where the codeword ZB contains a logic 1 at bit j+1 and logic 0's for all other bits.

The above described examples illustrate stable operation of the comparators. However, metastability is typically inevitable in any well-designed comparator when the inputs $V_{in}$ and reference voltage $V_{ref,\ i}$ are very close relative to each other. For example, if the comparator $C_j$ shown in FIG. 2 is in a metastable state, the output M of the metastable comparator $C_j$ is not well defined during the metastable period. Consequently, the subsequent transition detection logic circuit 150 of the thermometer-to-binary encoder may interpret the comparator output M as either high, i.e., logic 1, or low, i.e., logic 0, resulting in unpredictable outputs in the m-bit transition codeword $Z_c$.

When comparator $C_j$ is in metastable, there are four different possible AND gate results or transition codeword $Z_c$ at bits j and j+1: 00, 01, 10, and 11. The 01 and the 10 cases do not pose a problem since such transition codeword $Z_c$ outputs has only one logic high or 1 around the correct output code. However, problems arise with the 00 and the 11 cases. In either of these two cases, the output transition codeword $Z_c$ could become extreme codes causing a gross error in the final ADC output. Specifically, in the 00 case, the transition codeword $Z_c$ would contain all zeros such that the conversion logic of the thermometer-to-binary encoder would not turn on any word line in the encoder, resulting in an all zero final ADC output, for example. In the 11 case, the transition codeword $Z_c$ would contain two logic 1's such that the conversion logic of the thermometer-to-binary encoder would turn on two word lines in the encoder and outputs an n-bit binary code that is the sum of two word lines in the final ADC output, for example. Thus, either of the 00 or 11 case would result in a gross error in the final ADC output.

FIG. 3 is a table illustrating the mapping of the bit location of the logic 1 bit in the transition codeword T to the appropriate 4-bit word line ($b_3$, $b_2$, $b_1$, $b_0$) in the thermometer-to-binary encoder for outputting a 4-bit binary code digital output 112 for a 4-bit ADC. For example, as noted above, for a transition codeword T containing exactly one logic 1, the conversion logic of the thermometer-tobinary encoder would turn on the word line corresponding to the bit location of the logic 1. For a transition codeword T containing no logic 1, the conversion logic of the thermometer-to-binary encoder would turn on the word line corresponding to the 0000 word line. Further, for a transition codeword T containing more than one logic 1, the conversion logic of the thermometer-to-binary encoder would turn on the plurality of word lines corresponding to bit locations of the logic 1's.

FIG. 4 shows logic equations for implementing a two-step encoding process of a 4-bit ADC using two groups of internal intermediate signals $X_{0-3}$ and $E_{0-3}$ and two groups of intermediate converted signals $XP_{1-3}$ and $EP_{1-3}$ for reducing errors associated with metastability. Specifically, the two-step encoding process includes generating internal intermediate signals $X_{0-3}$ and $E_{0-3}$ using an intermediate encoding logic and generating intermediate converted signals $XP1-3$ and $EP_{1-3}$ using a converter logic. As shown, intermediate signals $X_{0-3}$ are determined from transition codeword T and are utilized to determine converted signals $XP1-3$. The converted signals $XP_{1-3}$ are in turn utilized to determine the two most significant bits ("MSBs"), i.e., $b_3$ and $b_2$, of the 4-bit binary code digital output of the ADC. In addition, intermediate signals $E_{0-3}$ are also determined from transition codeword T and are utilized to determine converted signals $EP_{1-3}$. The converted signals $EP_{1-3}$ are in turn utilized to determine the two least significant bits ("LSBs"), i.e., $b_1$ and $b_0$, of the 4-bit binary code digital output of the ADC. The final 4-bit binary code ADC output, i.e., $b_0$, $b_1$, $b_2$, and $b_3$, are generated by combining the converted signals XP and EP as shown.

As noted above, gross error in the final ADC output due to metastability occurs when the transition codeword includes two logic 1's, i.e., 2 bits having state 11. The logic scheme shown in FIG. 4 prevents this 11 state in the transition codeword T by converting each instance of 11 in the transition codeword T into 01. In other words, the converter logic converts the intermediate signals $X_{0-3}$ and $E_{0-3}$ into converted intermediate signals $XP_{1-3}$ and $EP_{1-3}$ such that the same converted intermediate signals $XP_{1-3\ and\ EP_{1-3}}$ result from intermediate signals corresponding to a transition codeword having more than one transition bit, i.e., 11, and intermediate signals corresponding to another transition codeword having one of said more than one transition bit, e.g., 01 or 10, to the same converted intermediate signals $XP_{1-3\ and\ EP_{1-3}}$.

Although the above description has been described in terms of a 4-bit ADC, the principles and concepts for reducing errors resulting from the metastable transition codeword having two logic 1's are applicable to other n-bit ADCs. In general, intermediate signals X are utilized to determine converted signals XP which are in turn utilized to determine the most significant bits ("MSBs"), i.e., approximately one-half of n, of the n-bit binary code digital output of the ADC. In addition, intermediate signals E are utilized to determine converted signals EP which are in turn utilized to determine the least significant bits ("LSBs"), i.e., approximately one-half of n, of the n-bit binary code digital output of the ADC. The final n-bits of the binary code ADC output are generated by combining the intermediate signals X and E.

Figure 5:
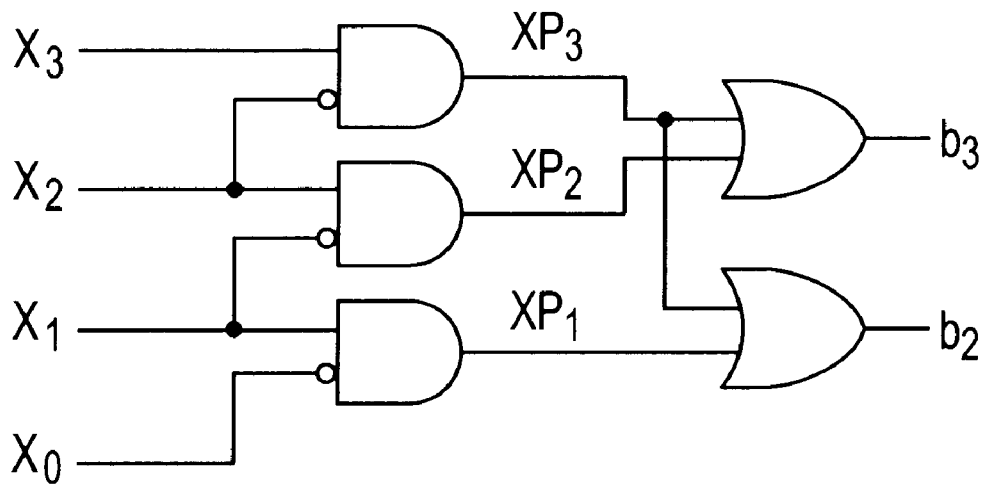
FIG. 5 shows an intermediate logic implementation for preventing the "11" case by converting each instance of "11" into "01"
Figure 5:
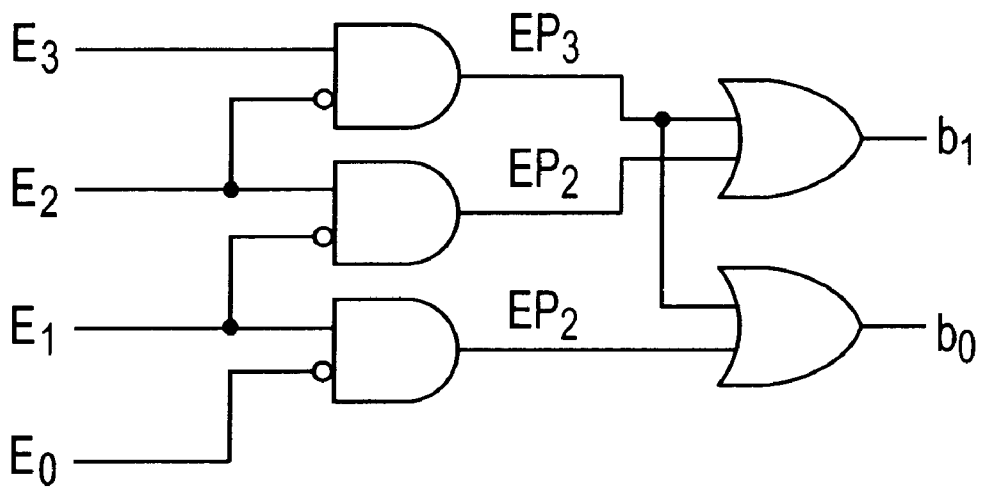

FIG. 5 shows an intermediate logic circuit 250 for implementing the logic scheme shown in FIG. 4 to prevent the 11 state in the transition codeword T by converting each instance of 11 into 01. In particular, the intermediate logic circuit 250 converts the 11 bits into 01 bits prior to a converted intermediate signals mapper maps the converted signals XP and EP to b, the final binary code ADC output. As shown, converted intermediate signals mapper includes OR gates having the converted intermediate signals as inputs.

In the 11 case, a metastable transition codeword contains all 0-bits except the two 1-bits. Thus, by inserting an intermediate logic shown in FIG. 5 into the logic of the thermometer-to-binary encoder of the ADC converter, the 11 case is converted into the 01 case. These converted signals XPs and EPs are then utilized to obtain the final ADC output b. This results in the final binary code output of the ADC close to the desired value when the result may otherwise result in gross error due to metastability since there is only one logic 1 in the transition codeword. Thus, this method corrects the metastability error due to 11.

The metastability error prevention methodology will now be illustrated by way of examples. In one 4-bit metastable ADC example, the transition codeword includes two logic 1's at bits 7 and 8 while all other bits are logic 0's. Using the equations shown in FIG. 4, the intermediate signals $\{X_0, X_1, X_2, X_3\}$ are $\{0, 1, 1, 0\}$ and the intermediate signals $\{E_0, E_1, E_2, E_3\}$ are $\{1, 0, 0, 1\}$, respectively. Utilizing a conventional thermometer-to-binary encoder, the final binary code ADC output $\{b_3, b_2, b_1, b_0\}$ would be $\{1, 1, 1, 1\}$. This would be a gross error as the correct output should be $\{0111\}$ or $\{1000\}$.

With the same metastable example above, utilizing the intermediate logic circuit 250 shown in FIG. 5 in the thermometer-to-binary encoder, the converted signals $\{XP_1, XP_2, XP3\}$ are $\{1, 0, 0\}$ and the converted signals $\{EP_1, EP_2, EP_3\}$ are $\{0, 0, 1\}$, respectively. Consequently, the final binary code ADC output $\{b_3, b_2, b_1, b_0\}$ would be $\{0, 1, 1, 1\}$. This is the same result as if the transitional codeword included exactly one logic 1 at bit 7. As is evident, the intermediate logic circuit 250 shown in FIG. 5 converted the 11 state in the transitional codeword to a 01 state, thereby preventing a gross error from occurring.

In addition to gross error occurring when the transition codeword includes two logic 1's, i.e., the 11 state, gross error in the final ADC output due to metastability may also occur when the transition codeword incorrectly only includes logic 0's. Thus, the 00 case desirably should also be prevented.

Figure 6A:
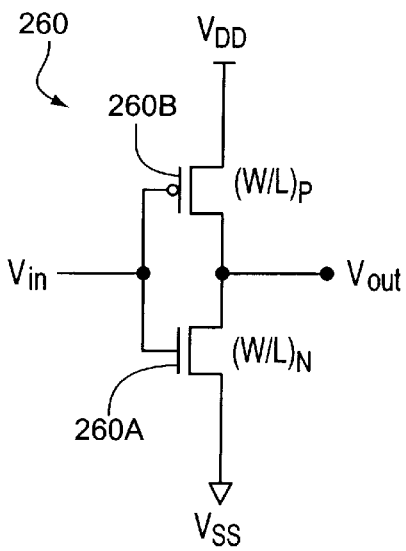
FIGS. 6A and 6B show an NMOS/PMOS inverter and its voltage transfer characteristic curve, respectively.
Figure 6B:
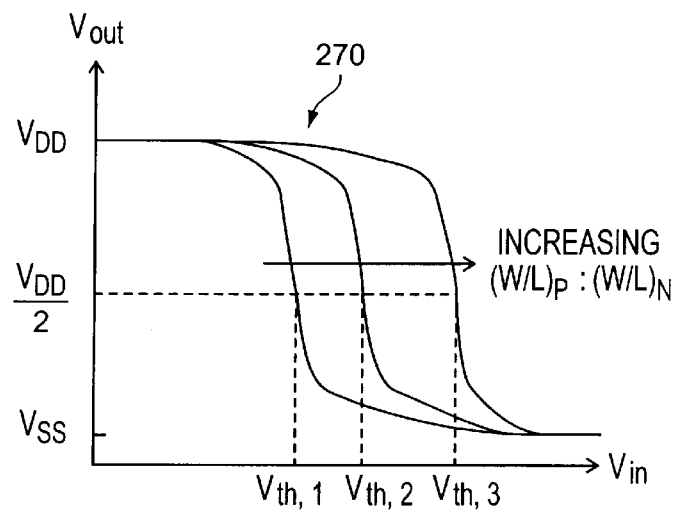
Figure 7:
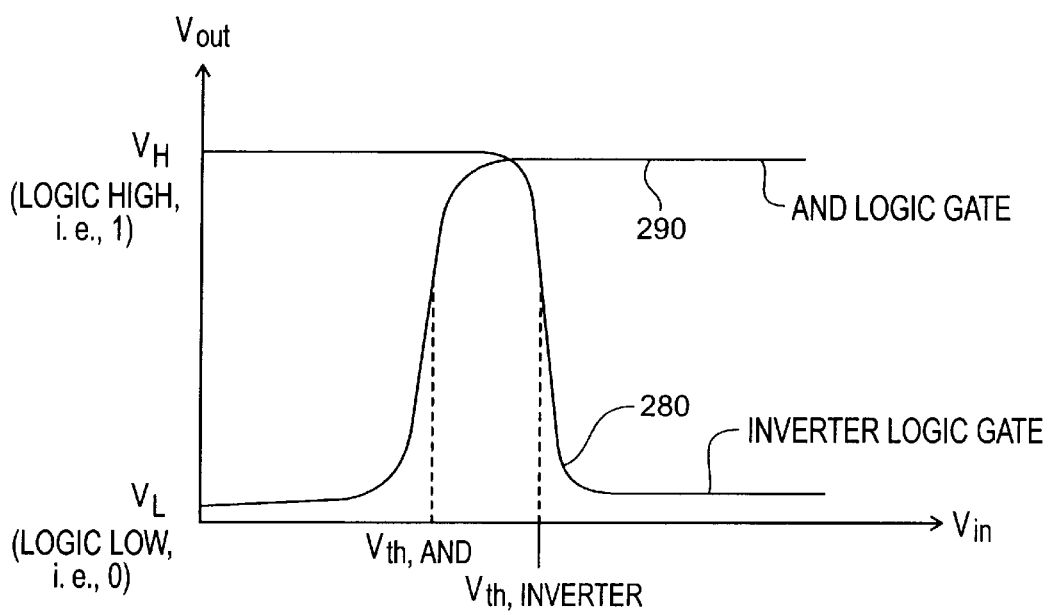
FIG. 7 illustrates voltage transfer characteristic curves of appropriately sized inverter and AND logic gates for preventing the "00" case from occurring.

FIGS. 6A and 6B show an NMOS/PMOS inverter 260 and its voltage transfer characteristic curve 270, respectively, and FIG. 7 illustrates voltage transfer characteristic curves 280, 290 of appropriately sized inverter logic gate and AND logic gate, respectively, of the transition detection logic circuit 150 for preventing the "00" case in the transition codeword from occurring.

As shown in FIG. 6A, the NMOS/PMOS inverter 260 typically includes an NMOS transistor 260A with a $(W/L)_N$ geometry and a PMOS transistor 260B with a $(W/L)_P$ geometry. FIG. 6B is a voltage transfer characteristic graph 270 illustrating the effects of increasing the ratio $(W/L)_P$:$(W/L)_N$. In particular, FIG. 6B illustrates the effects of varying the ratio $(W/L)_P$:$(W/L)_N$ on the threshold voltage $V_{th,\ inverter}$ of the inverter, typically defined as the level of the inverter input voltage $V_{in,\ inverter}$ at which the output voltage of the inverter $V_{out,\ inverter}$ is at one-half the supply voltage $V_{DD}$. As shown, as the ratio $(W/L)_P$:$(W/L)_N$ increases, the threshold voltage $V_{th,\ inverter}$ of the inverter also increases. Although not shown, the threshold voltage $V_{th,\ AND}$ of an AND logic gate can similarly be adjusted by adjusting the relative geometries of the PMOS and NMOS transistors.

Using the principles illustrated in FIG. 6B, FIG. 7 illustrates results of a method for preventing the "00" case in the transition codeword from occurring. In particular, the inverter and the AND logic gates of the transition detection logic circuit shown in FIG. 2 are appropriately sized such that the threshold voltages of the inverter and the AND logic gates are such that $V_{th,\ inverter} > V_{th,\ AND}$. Preferably, the difference $V_{th,\ inverter} - V_{th,\ AND}$ is at least approximately 5 to 25% of the supply voltage $V_{DD}$, i.e., approximately 0.15 V to 0.75 V for $V_{DD}$ of 3 V to further ensure desired results, i.e. prevention of the 00 state in the transition codeword from occurring. Further, $(W/L)_P:(W/L)_N$ may optionally be approximately 2:1 for the inverter and 1:2 for the AND (or NAND) gate.

Preferably, each inverter (reference number 152 in FIG. 2) has approximately the same threshold voltage and each AND gate (reference number 154 in FIG. 2) has approximately the same threshold voltage. Generally, the threshold voltage of each inverter is greater than a threshold voltage of the corresponding AND gate to which the output of each inverter is input.

Ensuring that $V_{th,\ inverter} > V_{th,\ AND}$ ensures that for any input voltage level, i.e., for any metastable output of the comparator, at least one output, i.e., transition codeword, is high so as to prevent the 00 state in the transition codeword from occurring. In particular, when a comparator is in a metastable state, the output of that metastable comparator is received by an inverter and an AND logic gate. Keeping the output of the inverter gate high or at logic 1, while keeping the output of the AND gate low or at logic 0 by selecting the appropriate threshold voltages of the two logic gates, $V_{th,\ inverter}$ and $V_{th,\ AND}$, the occurrence of the 00 metastable state would be greatly reduced and/or eliminated.

By appropriately sizing each of these two logic gates of the transition detection logic circuit to prevent the 00-metastable state from occurring and by implementing the above-described intermediate logic circuit to prevent the 11-state from occurring, gross errors in the n-bit binary code digital output of the ADC is greatly reduced or eliminated. Thus, a good bit error rate ("BER") is achieved without complicated encoding in ADC.

While the preferred embodiments of the present invention are described and illustrated herein, it will be appreciated that they are merely illustrative and that modifications can be made to these embodiments without departing from the spirit and scope of the invention. Thus, the invention is intended to be defined only in terms of the following claims.

What is claimed is:

1. An n-bit analog-to-digital converter having reduced errors due to metastability, comprising:
   a plurality of comparators each adapted to compare an analog input and one of a plurality of comparator reference voltages, said plurality of comparators configured to output a thermometer code corresponding to said analog input; and
   a thermometer-to-binary encoder for converting said thermometer code to a binary code digital output, wherein said thermometer-to-binary encoder includes:
      a transition detection logic adapted to detect a transition point in said thermometer code and to generate a transition codeword, said transition codeword having at least one transition bit corresponding to said transition point,
      an intermediate encoding logic adapted to encode said transition codeword into first intermediate signals;
      a converter logic adapted to convert said first intermediate signals into converted intermediate signals such that same converted intermediate signals result from first intermediate signals corresponding to a transition codeword having more than one transition bit and first intermediate signals corresponding to another transition codeword having one of said more than one transition bit; and
      a converted signals mapper for mapping said converted signals to said binary code digital output.

2. The n-bit analog-to-digital converter of claim 1, wherein said converter logic comprises AND gates and inverters.

3. The n-bit analog-to-digital converter of claim 1, wherein said converted signals mapper comprises OR gates.

4. The n-bit analog-to-digital converter of claim 1, wherein said binary code digital output includes most significant bits and least significant bits, said most and least significant bits being functions of a first and a second group of said converted intermediate signals, respectively, said first and a second group of said converted intermediate signals being functions of a first and a second group of said first intermediate group, respectively.

5. The n-bit analog-to-digital converter of claim 1, wherein said transition detection logic comprises inverters and AND gates, wherein outputs of said inverters are inputs to said AND gates.

6. The n-bit analog-to-digital converter of claim 5, wherein a threshold voltage of each inverter is greater than a threshold voltage of each corresponding AND gate to which said output of said each inverter is input.

7. The n-bit analog-to-digital converter of claim 6, wherein each of said inverter threshold voltage is between approximately 0.15 V and 0.75 V greater than each of said AND gate threshold voltage.

8. The n-bit analog-to-digital converter of claim 6, wherein each of said inverter threshold voltage is between approximately 5% and 25% greater than each of said AND gate threshold voltage.

9. The n-bit analog-to-digital converter of claim 1, wherein said analog-to-digital converter is a 4-bit analog-to-digital converter, said transition codeword includes 16 bits, said first intermediate signals includes $X_{0-3}$ and $E_{0-3}$, said $X_{0-3}$ being generated from said 16 bits of said transition codeword and said $E_{0-3}$ being generated from said 16 bits of said transition codeword, said converted intermediate signals includes $XP_{1-3}$ and $EP_{1-3}$ generated from $X_{0-3}$ and $E_{0-3}$, respectively.

10. The n-bit analog-to-digital converter of claim 9, wherein said binary code digital output comprises {$b_3$, $b_2$, $b_1$, $b_0$}, said $b_3$, $b_2$ being generated from said $XP_{1-3}$ and said $b_1$, $b_0$ being generated from said $EP_{1-3}$.

11. A method for converting a thermometer code to a binary code, comprising:
   generating a transition codeword according to a transition point in said thermometer code, said transition codeword having at least one transition bit corresponding to said transition point,
   encoding said transition codeword into first intermediate signals;
   converting said first intermediate signals into converted intermediate signals such that same converted intermediate signals result from first intermediate signals corresponding to a transition codeword having more than one transition bit and first intermediate signals corresponding to another transition codeword having one of said more than one transition bit; and
   mapping said converted signals to said binary code digital output.

12. The method for converting a thermometer code to a binary code according to claim 11, wherein said converting said first intermediate signals includes inverting said first intermediate signals and executing a logic AND function with one of said first intermediate signals and output of said inverting of another of said first intermediate signals as inputs.

13. The method for converting a thermometer code to a binary code according to claim 11, wherein said mapping includes executing a logic OR function with said converted signals as inputs.

14. The method for converting a thermometer code to a binary code according to claim 11, wherein said detecting said transition point including inverting and applying a logic AND function, wherein outputs of said inverting are inputs to said logic AND function.

15. The method for converting a thermometer code to a binary code according to claim 14, wherein said generating said transition codeword includes inverting with an inverter having an inverter threshold voltage and executing a logic AND function with an AND gate having an AND threshold voltage less than said inverter threshold voltage.

16. A method for converting an analog input into an n-bit digital output, comprising:

comparing said analog input and one of a plurality of comparator reference voltages to generate a thermometer code corresponding to said analog input; and converting said thermometer code to said n-bit digital output, said converting includes:

generating a transition codeword according to a transition point in said thermometer code, said transition codeword having at least one transition bit corresponding to said transition point, encoding said transition codeword into first intermediate signals;

converting said first intermediate signals into converted intermediate signals such that same converted intermediate signals result from first intermediate signals corresponding to a transition codeword having more than one transition bit and first intermediate signals corresponding to another transition codeword having one of said more than one transition bit; and mapping said converted signals to said binary code digital output.

* * * * *